(12) United States Patent
Kobayashi et al.

(10) Patent No.: US 9,224,788 B2
(45) Date of Patent: Dec. 29, 2015

(54) NONVOLATILE MEMORY DEVICE AND METHOD FOR MANUFACTURING SAME

(71) Applicant: Kabushiki Kaisha Toshiba, Minato-ku (JP)

(72) Inventors: Shigeki Kobayashi, Mie-ken (JP);
Takeshi Yamaguchi, Mie-ken (JP);
Masaki Yamato, Mie-ken (JP);
Yoshinori Nakakubo, Mie-ken (JP);
Hiroyuki Ode, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/208,204

(22) Filed: Mar. 13, 2014

(65) Prior Publication Data
US 2015/0155333 A1    Jun. 4, 2015

Related U.S. Application Data

(60) Provisional application No. 61/910,164, filed on Nov. 29, 2013.

(51) Int. Cl.
| | |
|---|---|
| *G11C 11/00* | (2006.01) |
| *H01L 27/24* | (2006.01) |
| *H01L 45/00* | (2006.01) |
| *G11C 13/00* | (2006.01) |

(52) U.S. Cl.
CPC .......... *H01L 27/249* (2013.01); *G11C 13/0007* (2013.01); *G11C 13/0069* (2013.01); *H01L 27/2454* (2013.01); *H01L 45/04* (2013.01); *H01L 45/1226* (2013.01); *H01L 45/146* (2013.01); *H01L 45/148* (2013.01); *H01L 45/149* (2013.01); *H01L 45/16* (2013.01); *G11C 2013/0071* (2013.01)

(58) Field of Classification Search
CPC .................................................... G11C 13/0007
USPC ............................................................ 365/148
See application file for complete search history.

(56) References Cited

U.S. PATENT DOCUMENTS

| 8,299,571 | B2 | 10/2012 | Ozawa et al. |
| 8,735,860 | B2 * | 5/2014 | Park et al. ........................ 257/2 |
| 2009/0189282 | A1 | 7/2009 | Takada et al. |
| 2011/0235408 | A1 | 9/2011 | Minemura et al. |

(Continued)

FOREIGN PATENT DOCUMENTS

| JP | 2009-188393 | 8/2009 |
| JP | 2011-129639 | 6/2011 |
| JP | 2011-199215 | 10/2011 |

*Primary Examiner* — Son Mai
(74) *Attorney, Agent, or Firm* — Oblon, McClelland, Maier & Neustadt, L.L.P.

(57) ABSTRACT

According to an embodiment, a nonvolatile memory device includes a first wiring extending to a first direction, a second wiring disposed on the first wiring in a second direction which is orthogonal to the first direction, a first insulating film provided between the first wiring and the second wiring, a bit line extending in the second direction, and a variable resistance film contacting an end portion of the first wiring, an end portion of the second wiring, and an end portion of the first insulating film. A dielectric constant of a center portion between the first and second wirings in the second direction is higher than at vicinities of the first and the second wirings. The variable resistance film is disposed between the bit line and the first wiring, between the bit line and the second wiring, and between the bit line and the first insulating film.

14 Claims, 10 Drawing Sheets

(56) References Cited

U.S. PATENT DOCUMENTS

| | | | |
|---|---|---|---|
| 2012/0161094 A1* | 6/2012 | Huo et al. | 257/4 |
| 2013/0034945 A1 | 2/2013 | Park | |
| 2013/0240821 A1* | 9/2013 | Toh et al. | 257/4 |
| 2013/0292630 A1* | 11/2013 | Sasago et al. | 257/4 |
| 2014/0027707 A1* | 1/2014 | Murooka | 257/5 |
| 2014/0061577 A1* | 3/2014 | Kanno et al. | 257/5 |
| 2014/0369104 A1* | 12/2014 | Murooka | 365/63 |
| 2015/0206580 A1* | 7/2015 | Toriyama | 365/148 |

* cited by examiner

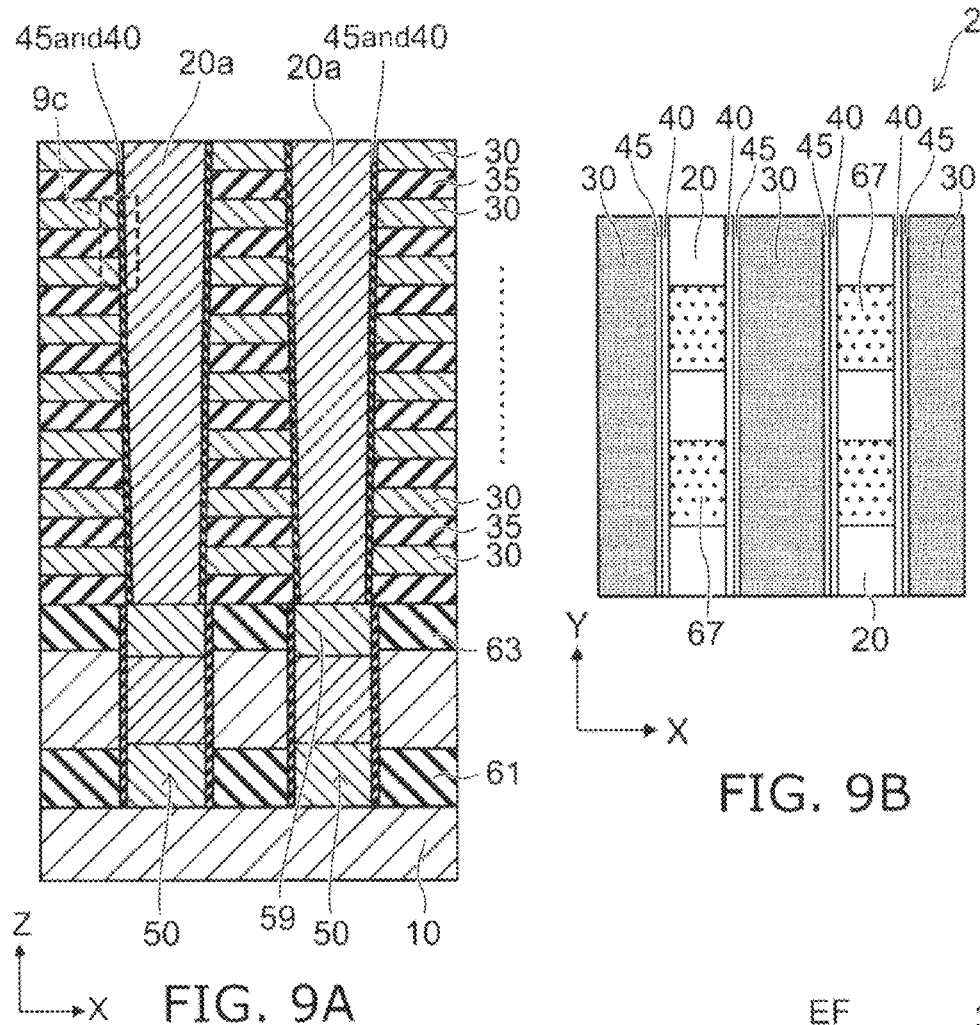
FIG. 9A
FIG. 9B
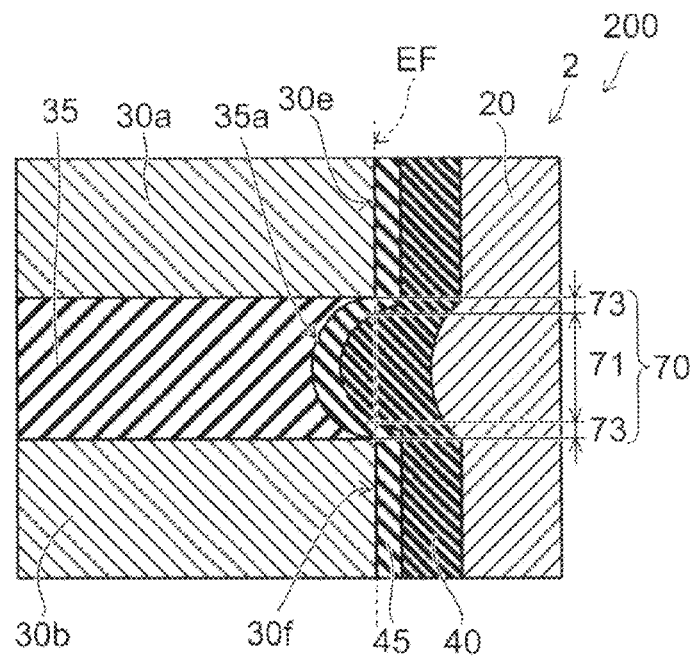
FIG. 9C

NONVOLATILE MEMORY DEVICE AND METHOD FOR MANUFACTURING SAME

CROSS-REFERENCE TO RELATED APPLICATIONS

This application is based upon and claims the benefit of priority from U.S. Provisional Patent Application 61/910,164, filed on Nov. 29, 2013; the entire contents of which are incorporated herein by reference.

FIELD

Embodiments described herein relate generally to a nonvolatile memory device and a method for manufacturing the same.

BACKGROUND

The development of memory cell arrays having three-dimensional structures is progressing to realize memory capacities necessary for next-generation nonvolatile memory devices. For example, a structure is studied, which includes a variable resistance film that is continuous in the vertical direction between a bit line and multiple word lines. The multiple word lines are stacked with an inter-layer insulating film interposed therebetween. In such a structure, an electric field may be applied between the bit line and an adjacent inter-layer insulating film, when a set voltage (or a reset voltage, read-out voltage, or the like) is applied to a selected memory cell. As a result, the variable resistance film between the inter-layer insulating film and the bit line may undesirably change the resistance thereof (or undergo dielectric breakdown), and then, the data stored in the memory cell may be changed unintentionally.

BRIEF DESCRIPTION OF THE DRAWINGS

FIGS. 6 to 9C are schematic drawings of manufacturing processes of a nonvolatile memory device according to a second embodiment.

DETAILED DESCRIPTION

Figure 1:
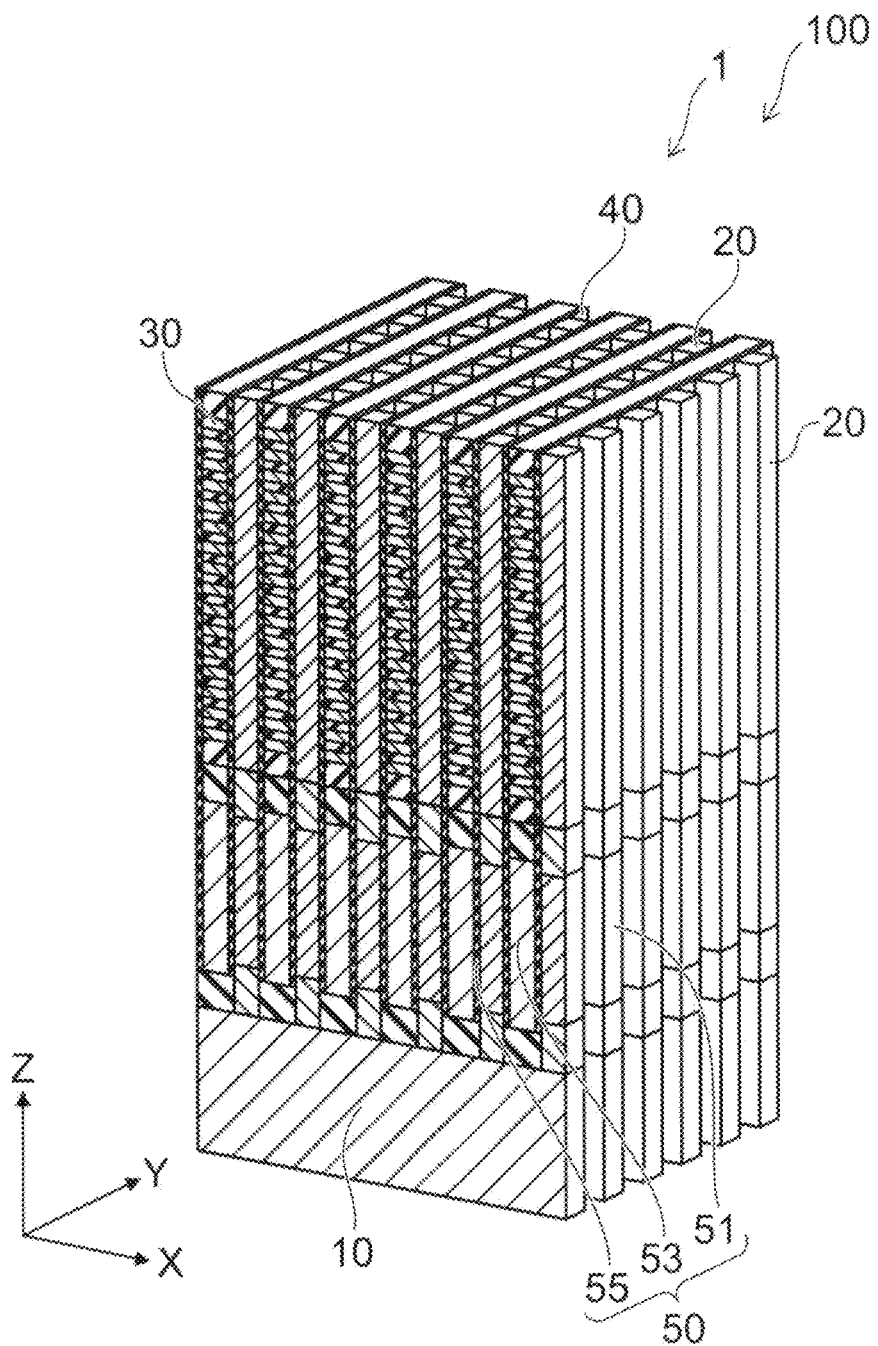
FIG. 1 is a schematic perspective drawing of a memory cell array of a nonvolatile memory device according to a first embodiment.

According to one embodiment, a nonvolatile memory device includes a first wiring extending to a first direction, a second wiring disposed on the first wiring in a second direction which is orthogonal to the first direction, a first insulating film provided between the first wiring and the second wiring, a bit line extending in the second direction, and a variable resistance film contacting an end portion of the first wiring, an end portion of the second wiring, and an end portion of the first insulating film. A dielectric constant of a center portion between the first wiring and the second wiring in the second direction is higher than at a vicinity of the first wiring and a vicinity of the second wiring. The variable resistance film is disposed between the bit line and the first wiring, between the bit line and the second wiring, and between the bit line and the first insulating film.

According to one embodiment, a method is disclosed for manufacturing a nonvolatile memory device. The method can include forming a stacked body including first insulating films and conductive layers stacked alternately, and making a trench in the stacked body. The method can include forming a second insulating film at an inner surface of the trench, and forming a variable resistance film on the second insulating film. In addition, the method can cause a metallic element included in the variable resistance film to diffuse into the second insulating film by heat treatment.

Various embodiments will be described hereinafter with reference to the accompanying drawings. Similar portions in the drawings are marked with like numerals and a detailed description is omitted as appropriate; and portions that are different are described. The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the description hereinbelow, the dispositions of the components are described with reference to three mutually-orthogonal axis directions, i.e., an X-direction, a Y-direction, and a Z-direction, that are shown in the drawings. Also, there are cases where the Z-direction is described as being upward, and the opposite direction is described as being downward.

First Embodiment

A nonvolatile memory device 100 according to a first embodiment includes a memory cell array 1 having a three-dimensional structure. The memory cell array 1 includes, for example, multiple resistance change memory cells MC, and a bit line that extends in the vertical direction (the Z-direction).

The nonvolatile memory device 100 according to the first embodiment will now be described with reference to FIGS. 1 to 4B.

FIG. 1 is a schematic perspective drawing of the memory cell array of the nonvolatile memory device according to the first embodiment. The memory cell array 1 includes multiple global bit lines 10 that extend in the X-direction, a local bit line 20 that extends in the Z-direction and is electrically connected to one of the global bit lines 10, and multiple word lines 30 that extend in the Y-direction.

The embodiment is not limited to the above example. For instance, the word lines 30 and the local bit line 20 are not always orthogonal each other. Their relationship is not very rigorous, rather including some tolerance. In some cases, the word lines 30 may be provided to cross the local bit line 20 with some declination from the orthogonal position due to inaccuracy in the manufacturing process.

The multiple global bit lines 10 are provided parallel to each other and are disposed to be arranged in the Y-direction. The local bit line 20 is electrically connected to the global bit line 10 via a selection element 50, e.g., a thin film transistor (Thin Film Transistor: TFT). Further, multiple local bit lines 20 are electrically connected to one global bit line 10.

The memory cell array 1 includes the multiple word lines 30. Further, the multiple word lines 30 are provided to extend in the Y-direction parallel to each other. Also, the word lines 30 are stacked in the Z-direction. The local bit line 20 is provided to extend in the Z-direction, and the two sides of the local bit line 20 opposed to each other faces the multiple word lines 30 through the variable resistance film 40.

A variable resistance film 40 is provided between the local bit line 20 and the word lines 30. The resistance states of the variable resistance film 40 can be changed reversibly, for example, from a low resistance state to a high resistance state. The change of a resistance state may be induced by applying voltage to the variable resistance film 40, making electric current flow therethrough, and/or heat generated by current flow.

The resistance change film 40 is formed of, for example, metal oxide including at least one element selected from the group consisting of hafnium (Hf), zirconium (Zr), nickel (Ni), tantalum (Ta), tungsten (W), cobalt (Co), aluminum (Al), iron (Fe), manganese (Mn), chrome (Cr), and niobium (Nb).

Also, for the resistance change film 40, material for the conduction-bridge type memory can be used, e.g., a single crystal or a polycrystal of Si, Ge, SiGe, GaAs, InP, GaP, GaInAsP, GaN, SiC, HfSi, HfO or AlO, or a combination of the above mentioned materials. In such a case, as the electrode of the resistance change film 40, for example, an electrode of Ag, Au, Ti, Ni, Co, Al, Fe, Cr, Cu, W, Hf, Ta, Pt, Ru, Zr, or Ir, a nitride thereof, a carbide thereof, etc., can be disposed between the resistance change film 40 and the local bit line 20 or between the resistance change film 40 and the word lines 30. Also, as a material for the electrode, polysilicon including the above mentioned material can be used.

The selection element 50 that is provided between the global bit line 10 and the local bit line 20 performs, for example, an ON/OFF control of the electrical conduction between the global bit line 10 and the local bit line 20. The selection element 50 is, for example, a thin film transistor that includes a conductive unit 51, a gate insulating film 55, and a gate electrode 53. In such a case, the current flows in the Z-direction.

In FIG. 1, the insulating films provided between the global bit lines 10 extending in the Y-direction and the local bit lines 20 extending in the Y-direction are not shown in order to simplify the drawing for easier understanding the device structure.

Figures 2A, 2B:
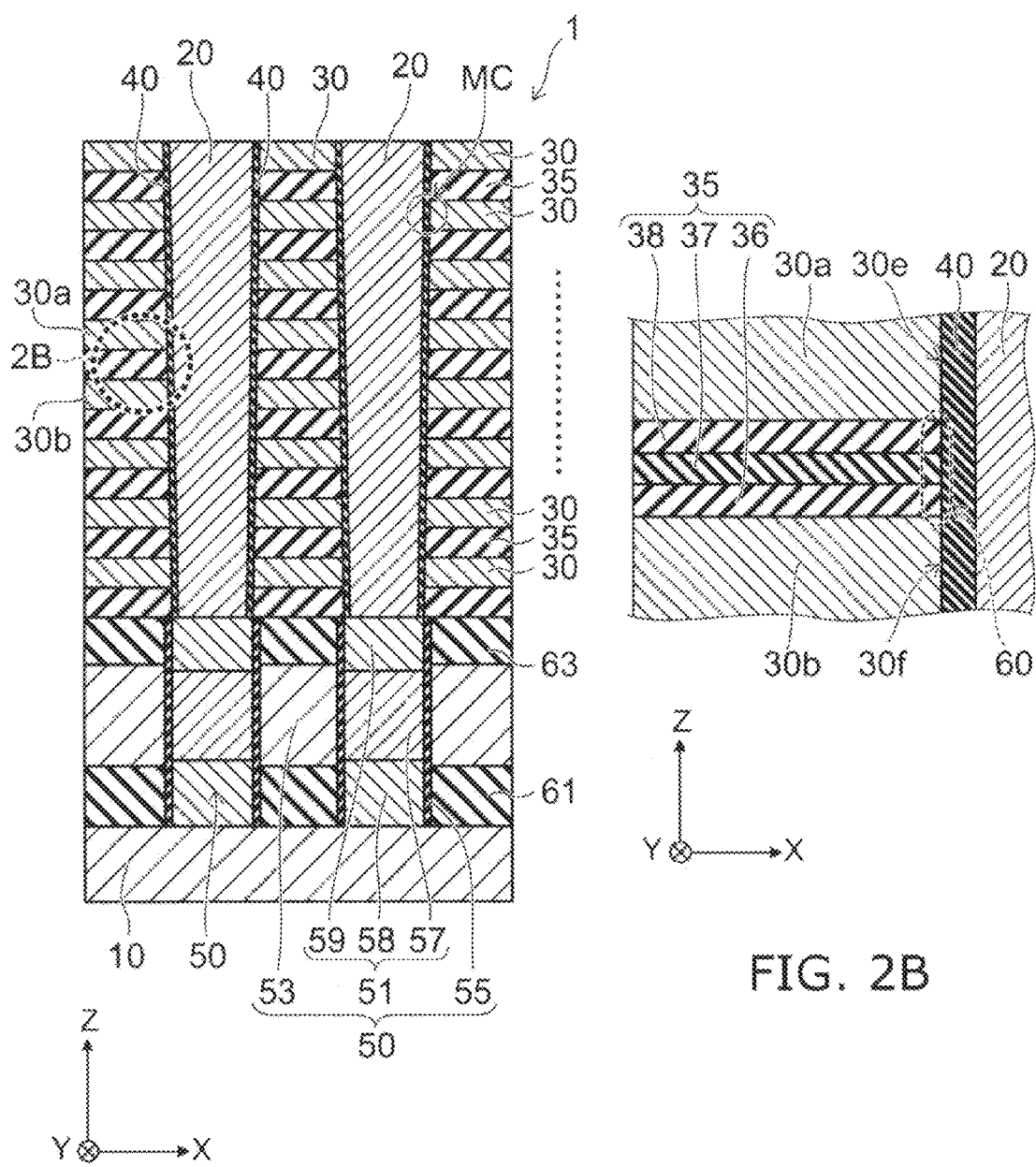
FIG. 2A and FIG. 2B are schematic cross-sectional drawings of the memory cell array of the nonvolatile memory device according to the first embodiment.

FIG. 2A and FIG. 2B are schematic cross-sectional drawings of the memory cell array 1 of the nonvolatile memory device 100 according to the first embodiment. FIG. 2A shows a cross-section of the X-Z plane of the memory cell array 1 shown in FIG. 1. FIG. 2B shows magnification of the region 2B marked with the broken line in FIG. 2A.

As shown in FIG. 2A, the selection element 50 is provided on the global bit line 10 in the Z-direction. The selection element 50 includes the conductive unit 51, the gate insulating film 55, and the gate electrode 53.

The conductive unit 51 includes a channel portion 57, and source-drain regions 58 and 59 that sandwich a channel portion 57. A gate insulating film 55 is provided between the channel portion 57 and the gate electrode 53. The source-drain unit 58 is connected to the global bit line 10. On the other hand, the source-drain unit 59 is connected to the local bit line 20.

An insulating layer 61 is provided between the global bit line 10 and the gate electrode 53. Also, an insulating layer 63 is provided on the gate electrode 53. The insulating layers 61 and 63 may be formed of silicon oxide, for example.

The local bit line 20 and the multiple word lines 30 are provided on the selection element 50. The multiple word lines 30 are stacked in the Z-direction with an inter-layer insulating film 35 (a first insulating layer) interposed. Also, the variable resistance film 40 is provided between the local bit line 20 and the word lines 30. Further, the memory cells MC are formed at the portions where the word lines 30 and the local bit line 20 converge.

As shown in FIG. 2B, the memory cell array 1 includes a first word line (hereinbelow, a word line 30a) and a second word line (hereinbelow, a word line 30b). The word line 30b is disposed under the word lines 30a via the inter-layer insulating film 35. The local bit line 20 extends upward (i.e. in the Z-direction). The local bit line 20 is disposed on a side of the word line 30a, the word line 30b and the inter-layer insulating film 35 via the variable resistance film 40. The variable resistance film 40 is provided continuously in the Z-direction between the local bit line 20 and the word line 30a, between the local bit line 20 and the word line 30b, and between the local bit line 20 and the inter-layer insulating film 35.

In the embodiment, the space that is between an end surface 30e of the word line 30a contacting the variable resistance film 40 and an end surface 30f of the word line 30b contacting the variable resistance film 40 is called a region 60. In the example, the region 60 includes the end portion of the inter-layer insulating film 35 contacting the variable resistance film 40. The dielectric constant in a center portion of the region 60 is higher than that in the vicinities of the word line 30a and 30b in the region 60.

The inter-layer insulating film 35 includes a first film 36, a second film 37, and a third film 38 that are stacked in order in the Z-direction. Here, "the vicinities of the word lines 30a and 30b" are the regions where the first film 36 and the third film 38 are provided. Also, this can be any region between the word line 30a and the surface of the third film 38 opposite to the word line 30a. Similarly, this can be any region between the word line 30b and the surface of the first film 36 opposite to the word line 30b. Also, the dielectric constant of the second film 37 is higher than the dielectric constants of the first film 36 and the third film 38. The second film 37 is, for example, a high-k film or a metal oxide film which has an ionic bond and a relative dielectric constant higher than 3.9. Also, the first film 36 and the third film 38 are, for example, silicon oxide films.

Figure 3:
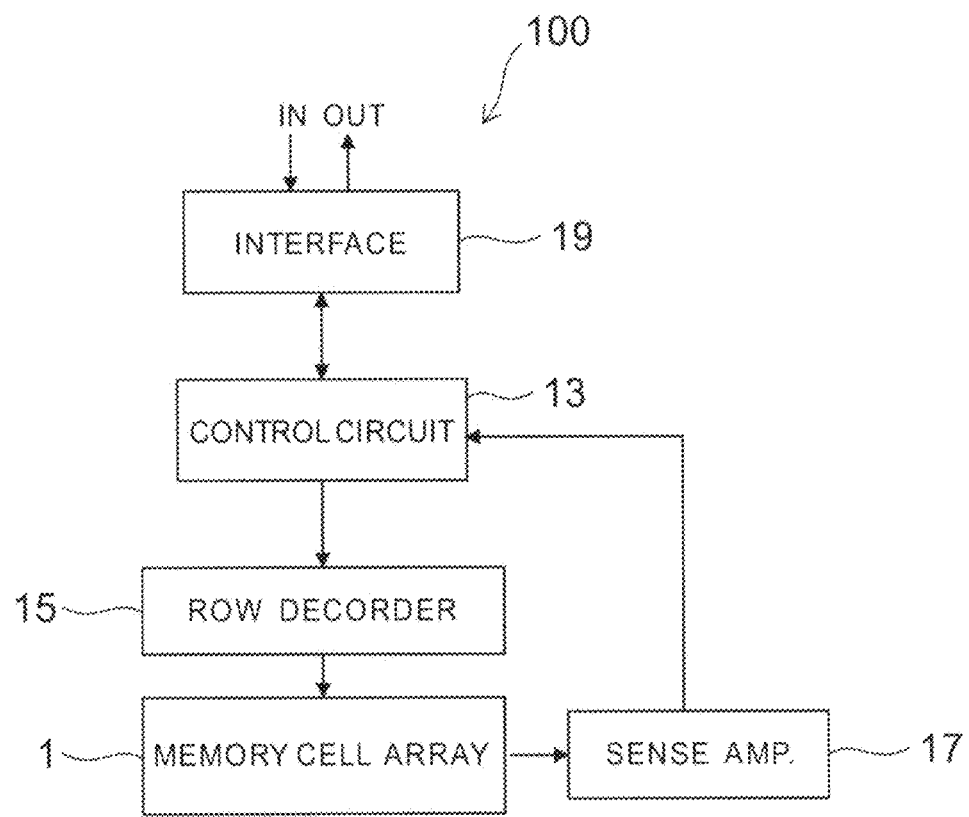
FIG. 3 is a block diagram schematically illustrating the nonvolatile memory device according to the first embodiment.

FIG. 3 is a block diagram that schematically illustrates the nonvolatile memory device 100 according to the first embodiment. The nonvolatile memory device 100 includes, for example, a sense amplifier 17 and a row decoder 15 capable of driving the memory cell array 1. The sense amplifier 17 can discriminate the data reading from the memory cell MC. The sense amplifier 17 may temporarily store the data. The nonvolatile memory device 100 further includes a control circuit 13 and an interface circuit 19. The control circuit 13 control to write the data in the memory cell array 1 and read the data form memory cell array 1 by using the row decoder 15 and the sense amplifier 17 based on commands from the outside via the interface circuit 19.

For example, the control circuit 13 selects one of the global bit lines 10 using the sense amplifier 17. Also, the control circuit 13 selects one of the local bit lines 20 provided on the selected global bit line 10 using the row decoder 15. Specifically, the local bit line 20 selected by turning on the selection element 50 by applying a gate voltage to the gate electrode 53. Then, the selected global bit line 10 is electrically connected to the selected local bit line 20.

Further, the control circuit 13 selects one of the memory cells MC provided between the selected local bit line 20 and one of the word lines 30.

For example, in the case where the data stored in the memory cell MC is read, the control circuit 13 provides a first potential difference between the selected word line 30a and the selected local bit line 20. Then, the control circuit 13 senses the current flowing in the selected global bit line 10 using the sense amplifier 17. Then, the sense amplifier 17 designates the data based on the current flowing. Then, the data stored in the memory cell MC output via the interface circuit 19. Here, the control circuit 13 applies a voltage smaller than the first potential difference mentioned above to the unselected word lines 30b other than the selected word line 30a.

Also, in the case where programming (setting) data in the memory cell MC is performed or in the case where erasing (resetting) the data stored in the memory cell MC is performed, a second potential difference is provided between the selected word line 30a and the selected local bit line 20 such that the resistance state of the memory cell MC changes from a first state to a second state or reversely. Here, the control circuit 13 applies a voltage smaller than the second potential difference mentioned above to the unselected word lines 30b, in order to make potential difference between the selected word line 30a and the unselected word lines 30b.

For example, the row decoder 15 (a first circuit) applies a first potential to the word line 30a and applies a second potential to the word line 30b. On the other hand, the sense amplifier 17 (a second circuit) applies a fourth potential to the local bit line by applying a third potential to the global bit line 10. Also, the control circuit 13 controls the fourth potential to be higher than the first potential and the second potential. Also, the control circuit 13 may control the fourth potential to be lower than the first potential and the second potential. Here, the fourth potential simply may be considered to be substituted for the third potential.

Figure 4A:
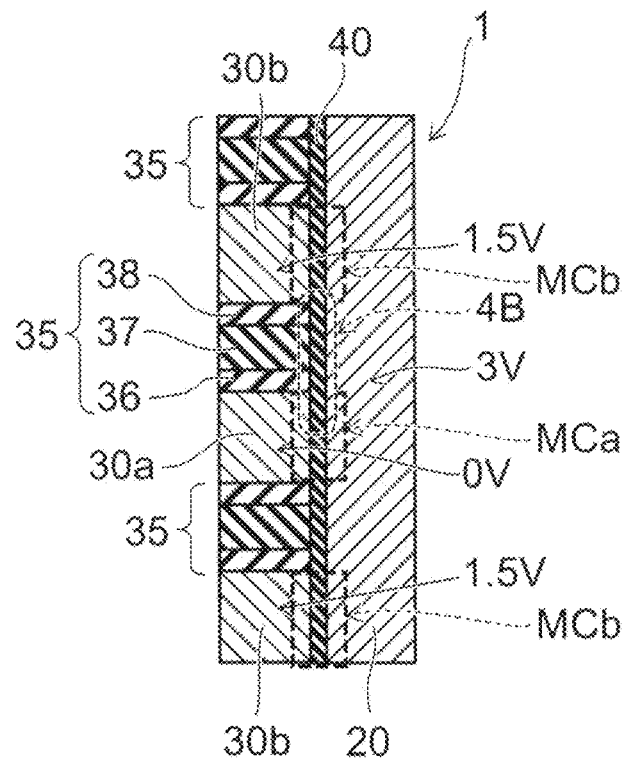
FIGS. 4A and 4B are schematic drawings of the operating state of the nonvolatile memory device according to the first embodiment.
Figure 4B:
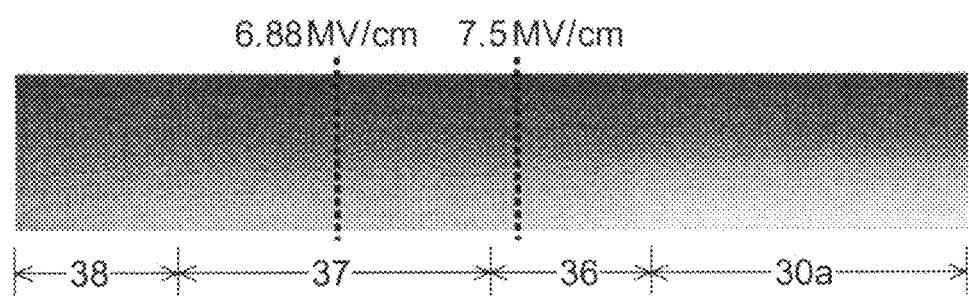

FIGS. 4A and 4B are schematic drawings of the operating state of the nonvolatile memory device 100 according to the first embodiment. FIG. 4A is a partial cross-sectional drawing of the memory cell array 1; and FIG. 4B is a schematic drawing of the electric potential distribution of the variable resistance film 40 of the dotted line portion of FIG. 4A.

Figure 10A:
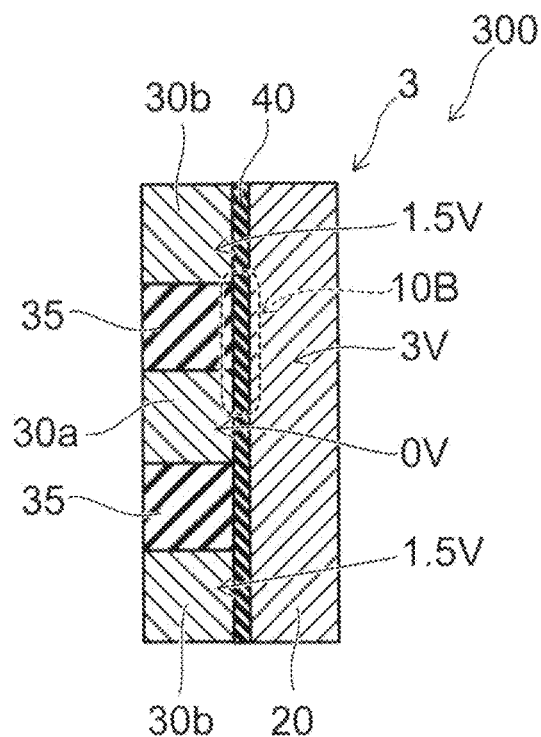
FIG. 10A and FIG. 10B are schematic drawings of the operating state of a nonvolatile memory device according to a comparative example.
Figure 10B:
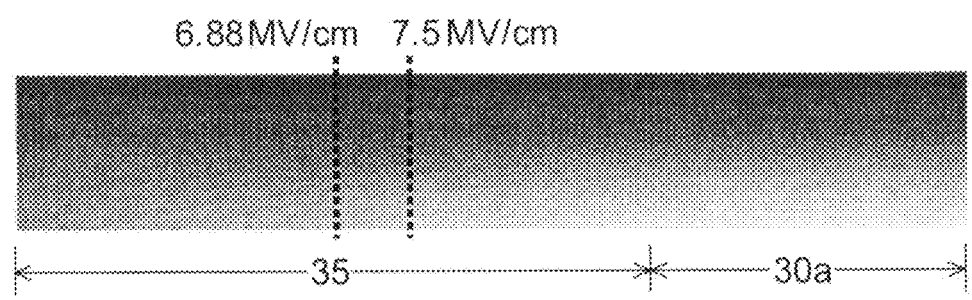

Also, FIGS. 10A and 10B illustrate the operating state of a nonvolatile memory device 300 according to a comparative example. FIG. 10A is a partial cross-sectional drawing of a memory cell array 3 according to the comparative example; and FIG. 10B is a schematic drawing of the electric potential distribution of the variable resistance film 40 of the dotted line portion of FIG. 10A. The change of the electric potential is shown as a gradation in FIGS. 4 and 10; the electric potential is the same in regions which are painted with the same color. The electric potential is high at the dark portions; and the electric potential decreases as the color becomes lighter.

As shown in FIGS. 4A and 10A, a selected memory cell MCa includes a part of the variable resistance film 40 that is disposed between the selected word line 30a and the local bit line 20. Also, unselected memory cells MCb include other parts of the variable resistance film 40 that is disposed between the local bit line 20 and the unselected word lines 30b. The electric potential distributions shown in FIG. 4B and FIG. 10B exhibit the state, wherein the voltage of the selected word line 30a (a first voltage) is 0 (zero) V; the voltage of the unselected word lines 30b (a second voltage) is set to be 1.5 V; and a voltage applied to the local bit line 20 (a third voltage) is about 3 V, for example. A voltage applied to the global bit line 10 is slightly higher than 3 V, for example.

In the memory cell array 3 shown in FIG. 10A, the inter-layer insulating film 35 is, for example, a single-layer silicon oxide film. In the memory cell array 1 shown in FIG. 4A, the inter-layer insulating film 35 includes the first film 36, the second film 37, and the third film 38. The first film 36 and the third film 38 are silicon oxide films, and the second film 37 is a hafnium oxide (HfO) film in a simulation of the electric potential distribution shown in FIG. 4B. Also, the ratio of the film thicknesses (first film 36:second film 37:third film 38) is 1:2:1 in a simulation for FIG. 4B.

Inside the variable resistance film, the electric fields in a region which is far from the selected word line 30a are weaker than those in a region which is close to the selected word line 30a. In addition, as shown in FIG. 4B and FIG. 10B, the electric fields in a region which is far from the selected word line 30a are weaker in the memory cell array 1, comparing to the memory cell array 3. In other word, a region in which the electric fields are strong is concentrated near the selected word line 30a. For example, a position in which the strength of the electric fields is 7.5 MV/cm locates closer to the selected word line 30a in the memory cell array 1, comparing to the memory cell array 3.

The inter-layer insulating film 35 includes multiple materials having different dielectric constants, and the dielectric constant of the inter-layer insulating film 35 is relatively lower at the vicinities of the word lines 30, comparing to the center of the inter-layer insulating film 35. The gradient of dielectric constant in the inter-layer insulating film 35 affects the electric potential gradient in the variable resistance film near the selected word line 30a and the inter-layer insulating film 35. Through a simulation study performed by the inventors, it is found that when the dielectric constant is higher at the center of the inter-layer insulating film 35, a region in which the electric fields are strong can be concentrated near the selected word line 30a. Thus it is possible to suppress the unwanted resistance change (or the dielectric breakdown) of the variable resistance films 40 in a portion far from the selected word line 30a, and is sandwiched by the inter-layer insulating film 35 and the local bit line 20. As a result, the fluctuation of the data stored in the memory cells MC can be reduced.

Second Embodiment

Figure 5:
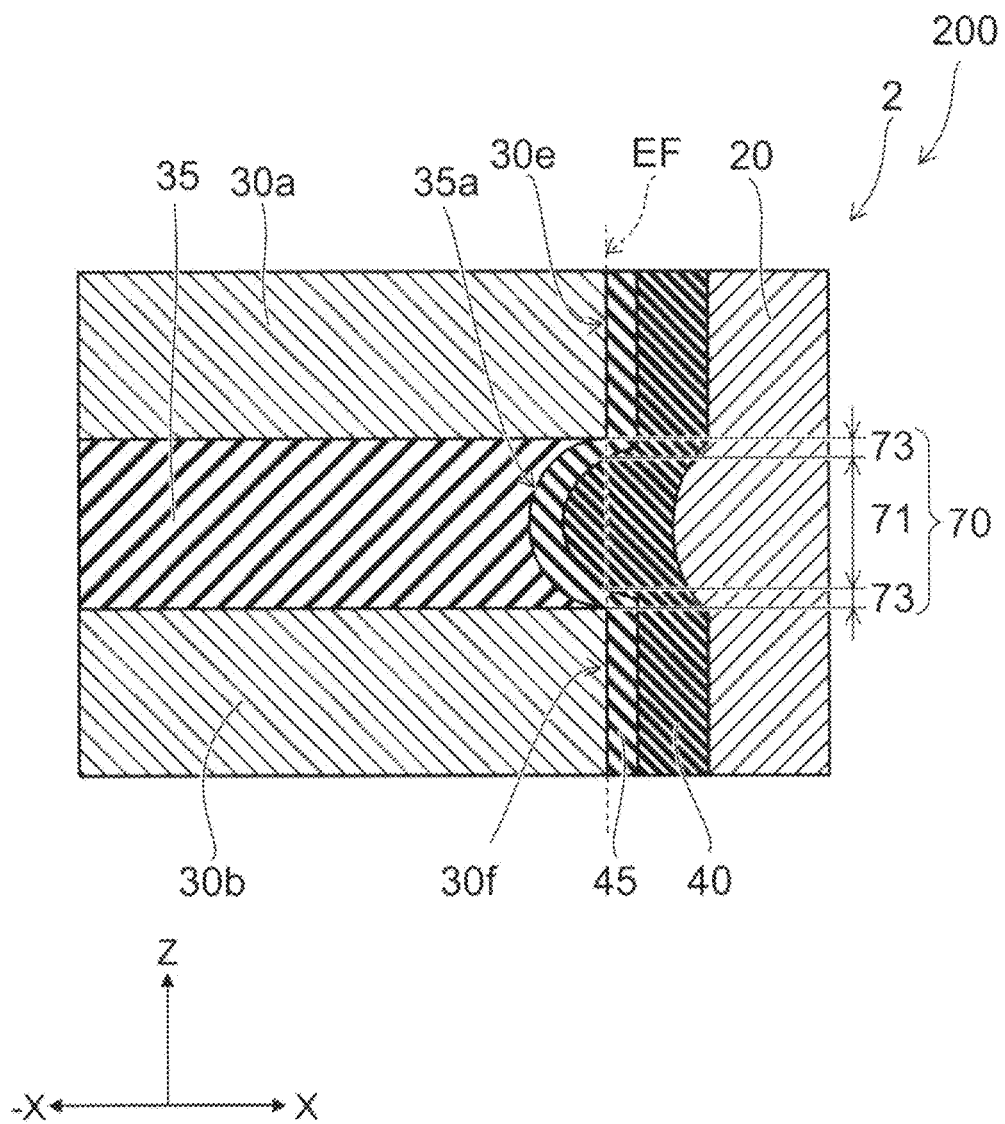
FIG. 5 is a schematic cross-sectional drawing of a memory cell array of a nonvolatile memory device according to a second embodiment.

FIG. 5 is a schematic cross-sectional drawing of a memory cell array 2 of a nonvolatile memory device 200 according to a second embodiment. FIG. 5 shows a magnification of a portion of the memory cell array 2, and corresponds to the region 2B shown in FIG. 2A.

As shown in FIG. 5, the memory cell array 2 includes the word line 30a and the word line 30b. The word line 30b is disposed under the word lines 30b via the inter-layer insulating film 35. The local bit line 20 extends upward (i.e. in the Z-direction) and is disposed on a side of the word line, the word line 30b and the inter-layer insulating film 35 via the variable resistance film 40. The variable resistance film 40 is provided continuously in the Z-direction between the local bit line 20 and the word line 30a, between the local bit line 20 and the word line 30b, and between the local bit line 20 and the inter-layer insulating film 35.

In the example, the inter-layer insulating film 35 is a single layer; and an end surface 35a of the inter-layer insulating film 35 is at a position recessed further in the –X direction than the end surfaces 30e and 30f of the word lines 30. Also, a second insulating film (hereinbelow, an insulating film 45) is provided between the inter-layer insulating film 35 and the variable resistance film 40 and between the variable resistance film 40 and the end surfaces of each word line 30. The dielectric constant of the insulating film 45 is lower than the dielectric constant of the variable resistance film 40. The insulating film 45 is, for example, a silicon oxide film. Also, it is preferable for the variable resistance film 40 to include, for example, a metallic element such as hafnium (Hf) or the like. Then, the insulating film 45 is preferably provided so as to include the metallic element that is diffused from the variable resistance film 40. Also, the inter-layer insulating film 35 is, for example, a silicon oxide film; and the dielectric constant of the inter-layer insulating film 35 is lower than that of the variable resistance film 40.

Further, the variable resistance film 40 has a portion between the word lines 30a and 30b that protrudes toward the inter-layer insulating film 35 side (the −X direction) than a plane EF along the end surfaces 30e and 30f of the word lines 30a and 30b. Thereby, the dielectric constant at a center portion 71 in a region 70 between the ends of the word line 30a and the word line 30b is higher than that at the vicinities 73 in the region 70. Here, "the vicinities 73" are the regions where the insulating film 45 is formed on the extension line from the end surfaces 30e and 30f in the Z-direction. Also, a lower of "the vicinity 73" may be any region which the extension portion of the insulating film 45 form end surface 30f. Similarly, an upper of "the vicinity 73" may be any region which the extension portion of the insulating film 45 form end surface 30e.

In other words, on the plane EF along the end surfaces 30e and 30f, the dielectric constant of vicinities 73 is lower than that of the central portion 71. The vicinities 73 indicate a portion of the insulating film 45 provided between the word line 30a and a central portion 71, and a portion of the insulating film 45 provided between the word line 30b and the central portion 71. The central portion 71 is a portion of the variable resistance film 40 that has a higher dielectric constant than that of the insulating film 45. Thereby, it is possible to relax the electric fields inside the variable resistance film at the portion where the inter-layer insulating film 35 faces the local bit line 20. As a results, it is possible to suppress the unwanted resistance change (or the dielectric breakdown) of the variable resistance films 40 outside the memory cells.

Figure 6:
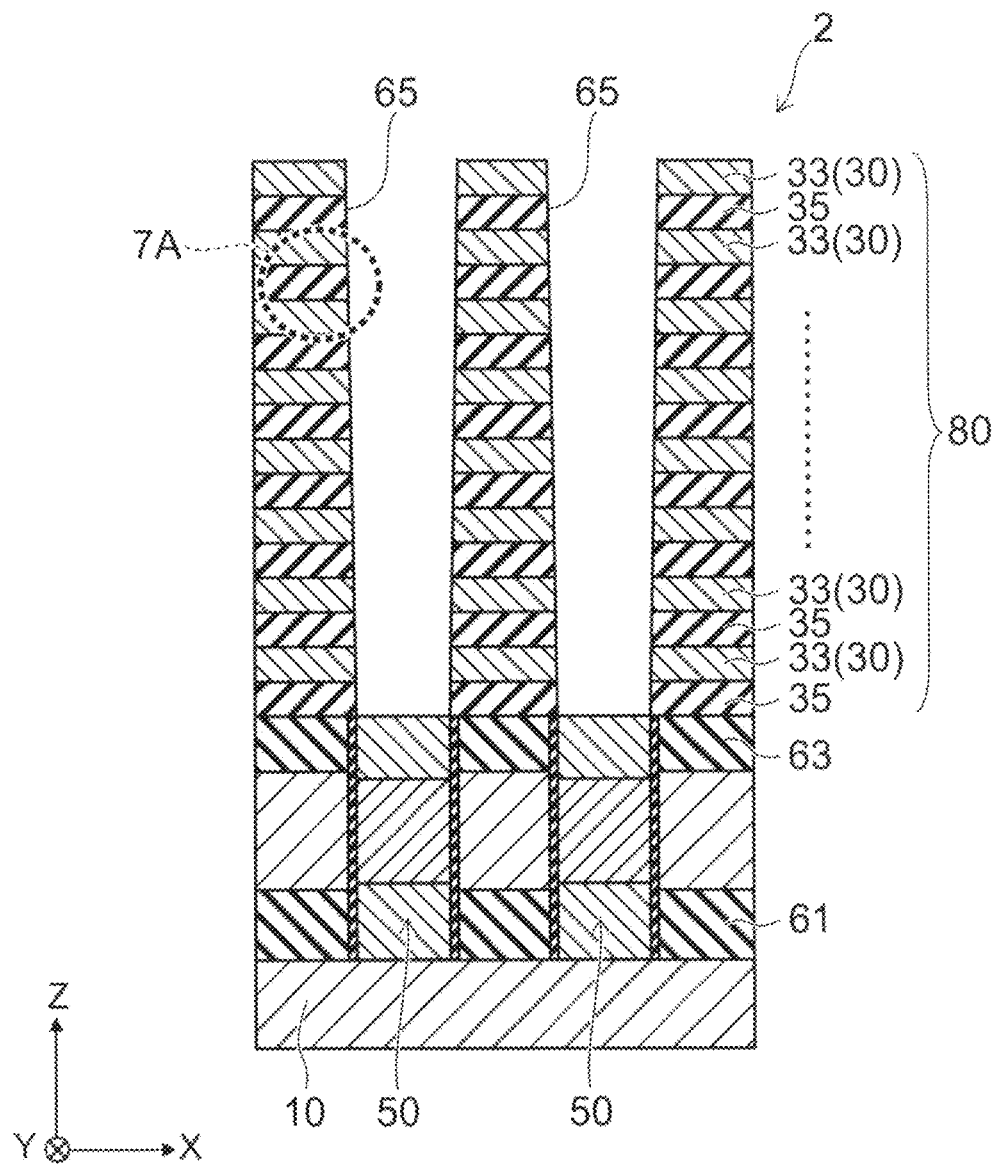

A method for manufacturing the nonvolatile memory device 200 according to the second embodiment will now be described with reference to FIG. 6 to FIG. 9B. FIGS. 6 to 9B are schematic drawings of manufacturing processes of the nonvolatile memory device 200 according to the second embodiment. FIG. 6 and FIG. 9A are cross-sectional drawings of the X-Z plane of the memory cell array 2. FIGS. 7A to 8B show magnification of the region 7A shown in FIG. 6.

In the embodiment, the selection element 50 is formed above the global bit line 10; and a stacked body 80 is formed above the selection element 50. The stacked body 80 includes conductive films 33 and inter-layer insulating films 35. The conductive films 33 are, for example, conductive polycrystalline silicon films, or metal films; and the inter-layer insulating films 35 are, for example, silicon oxide films. The conductive films 33 and the inter-layer insulating films 35 are stacked alternately.

Then, as shown in FIG. 6, a trench 65 is made to divide the stacked body 80. The trench 65 is formed using RIE (Reactive Ion Etching) method, for example, so as to extend in the Y-direction. Thereby, the conductive films 33 are divided into the word lines 30.

Figure 7A:
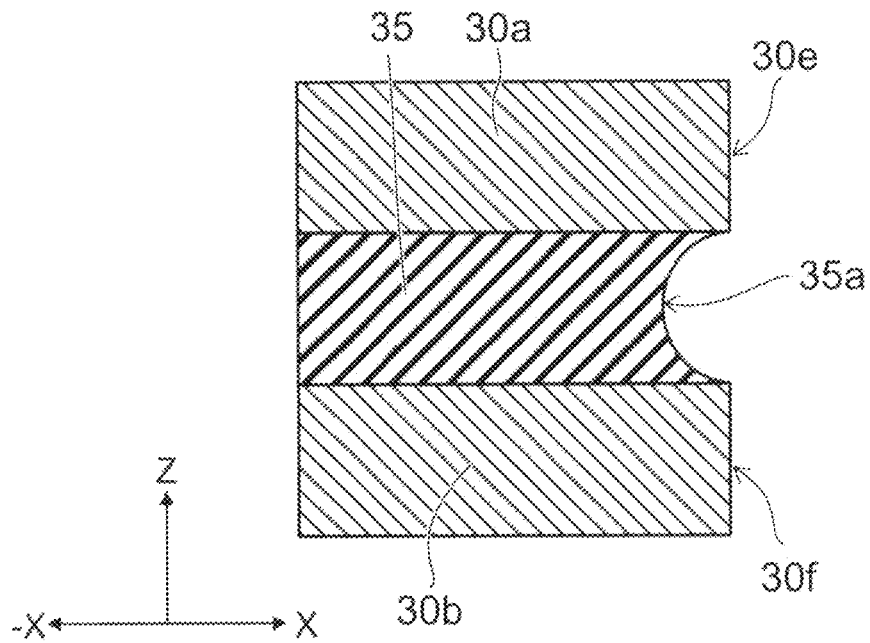

Then, as shown in FIG. 7A, the inter-layer insulating film 35 that is exposed between the word lines 30a and 30b at the inner surface of the trench 65 is etched so that the end surface 35a of the inter-layer insulating film 35 is recessed in the −X direction. In other words, the end surface of the inter-layer insulating film 35 that is exposed at the inner wall of the trench 65 is recessed, comparing to the end surfaces 30e and 30f of the word lines 30. For example, the end surface of the inter-layer insulating film 35 may be recessed by using a selective etching of the inter-layer insulating film 35, for example, by using dilute hydrofluoric acid (wet etching).

Figure 7B:
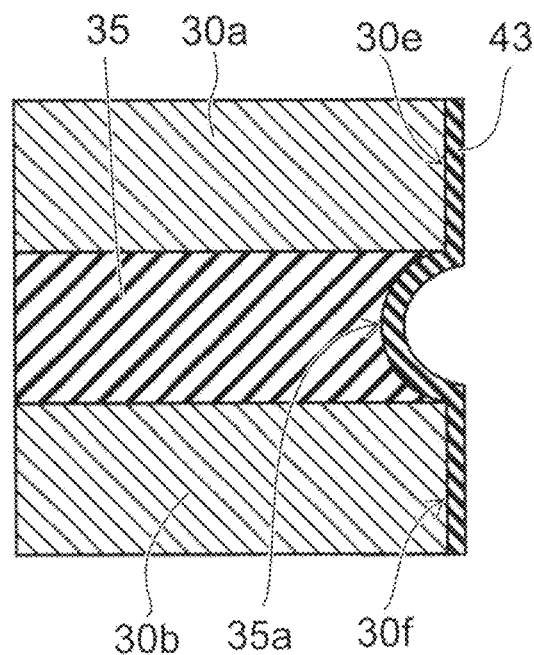

As shown in FIG. 7B, an insulating film 43 is formed at the inner surface of the trench 65. Here, the insulating film 43 can be formed conformally on the inner surface of the trench 65. The insulating film 43 is, for example, a silicon oxide film and is formed by ALD (Atomic Layer Deposition). As shown in this drawing, the insulating film 43 continuously covers the end surfaces 30e and 30f of the word lines 30 and the end surface 35a of the inter-layer insulating film 35.

Figure 8A:
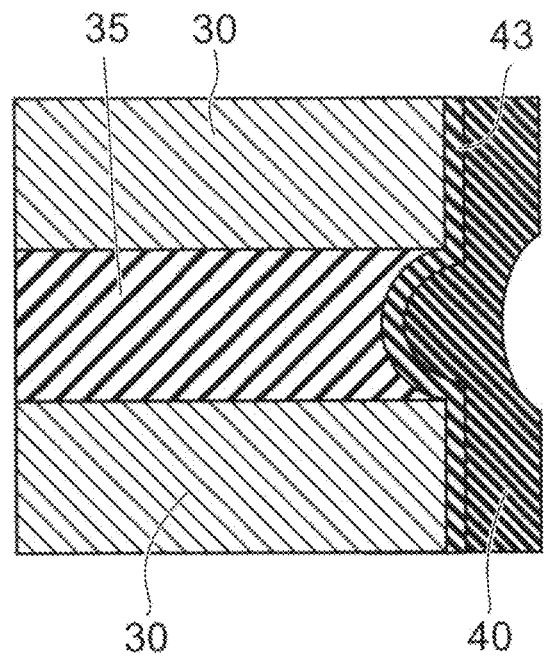

Then, as shown in FIG. 8A, the variable resistance film 40 is formed on the insulating film 43 at the inner surface of the trench 65. The variable resistance film 40 includes, for example, an oxide of at least one element selected from the group consisting of hafnium (Hf), zirconium (Zr), nickel (Ni), tantalum (Ta), tungsten (W), cobalt (Co), aluminum (Al), iron (Fe), manganese (Mn), chrome (Cr), and niobium (Nb).

Figure 8B:
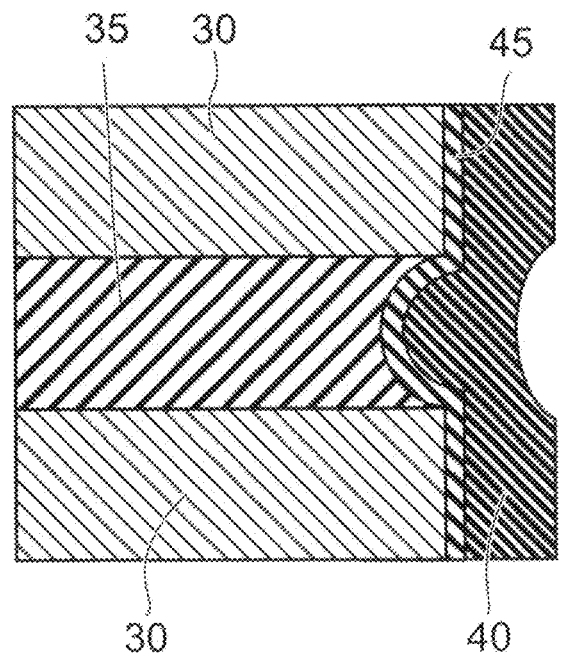

Then, as shown in FIG. 8B, the metallic element included in the variable resistance film 40 is diffused into the insulating film 43 by performing heat treatment of the insulating film 43 and the variable resistance film 40. Thereby, the insulating film 43 changes into the insulating film 45 that includes the same metallic element as the variable resistance film 40. In the case where the variable resistance film 40 includes, for example, an oxide of hafnium (Hf), the insulating film 45 also includes hafnium.

Then, as shown in FIG. 9A, the local bit line 20 is formed by filling a conductor 20a into the interior of the trench 65. The local bit line 20 is electrically connected to, for example, the source-drain unit 59 of the selection element 50.

FIG. 9B is a top-view drawing of the upper surface (in-plan direction) of the memory cell array 2 in which the local bit line 20 is formed. The conductor 20a which is the material of the local bit line 20 is, for example, conductive polycrystalline silicon. As shown in FIG. 9B, the conductor 20a is subdivided into substantially columnar bodies extending in the Z-direction. Each columnar body serves as the local bit line 20; and an insulator 67 is filled between the local bit lines 20 arranged in the Y-direction. The insulator 67 is, for example, a silicon oxide film.

In the manufacturing processes of the local bit lines 20, the conductors 20a are etched into the substantially columnar bodies by using, for example, RIE method. In such a case, selectivity of the etching is preferably set to be high between the variable resistance film 40 and the conductors 20a. Thereby, the formation of the local bit lines 20 becomes easy. Also, in the etching process of the conductors 20a, the variable resistance film 40 protects the word lines 30 so as to suppress damages therein.

FIG. 9C is a cross-sectional drawing of part 9c of the memory cell array 2, which has the same structure as the one explained in reference to FIG. 5.

As recited above, compared to the first embodiment in which the inter-layer insulating film 35 includes multiple films, the manufacturing processes are simplified in the method according to the embodiment. Also, the parasitic capacitance between the word lines 30 can be reduced, because the inter-layer insulating film 35 does not include a high dielectric constant film.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile memory device, comprising:
a first wiring extending in a first direction;
a second wiring disposed on the first wiring in a second direction which is orthogonal to the first direction;
a first insulating film provided between the first wiring and the second wiring;
a bit line extending in the second direction; and
a variable resistance film contacting an end portion of the first wiring, an end portion of the second wiring, and an end portion of the first insulating film, the variable resistance film being disposed between the bit line and the first wiring, between the bit line and the second wiring, and between the bit line and the first insulating film,
a dielectric constant of a center portion between the first wiring and the second wiring in the second direction being higher than at a vicinity of the first wiring and a vicinity of the second wiring.

2. The device according to claim 1, wherein
the first insulating film includes a first film, a second film, and a third film stacked in order in the second direction, and
a dielectric constant of the second film is larger than that of the first film and the third film.

3. The device according to claim 2, wherein the first film, the second film, and the third film include the same element.

4. The device according to claim 3, wherein the first film and the third film include the same material.

5. The device according to claim 2, wherein the first film, the second film, the third film, and the variable resistance film include the same element.

6. The device according to claim 2, wherein the second film includes a metal oxide film having an ionic bond and a relative dielectric constant which is higher than 3.9.

7. The device according to claim 1, wherein a first portion of the variable resistance film protrudes toward the first insulating film, and the first portion is directly disposed between the first wiring and the second wiring.

8. The device according to claim 7, further comprising a second insulating film provided between the variable resistance film and the first wiring, between the variable resistance film and the second wiring, and between the variable resistance film and the first insulating film, a dielectric constant of the second insulating film being lower than that of the variable resistance film.

9. The device according to claim 8, wherein a second portion of the second insulating film is an extension portion of the second insulating film formed at an end surface of the first wiring in the second direction.

10. The device according to claim 8, wherein the variable resistance film and the second insulating film include hafnium (Hf).

11. The device according to claim 8, wherein the first insulating film and the second insulating film include the same element.

12. The device according to claim 1, further comprising:
a global bit line extending in a direction orthogonal to the first direction and the second direction; and
a selection element provided between the global bit line and the bit line.

13. The device according to claim 12, further comprising a control circuit capable of:
applying a first potential to the first wiring and applying a second potential to the second wiring; and
applying a third potential to the global bit line,
the control circuit being configured to control the third potential to be higher than the first potential and the second potential.

14. The device according to claim 1, further comprising a control circuit capable of:
applying a first potential to the first wiring and applying a second potential to the second wiring; and
applying a third potential to the global bit line,
the control circuit being configured to control the third potential to be lower than the second potential and the first potential.

* * * * *